(12) United States Patent
Liaghati

(10) Patent No.: US 9,520,894 B1
(45) Date of Patent: Dec. 13, 2016

(54) SIGNAL ENCODING AND COMPRESSION WITH DYNAMIC DOWNSAMPLING

(71) Applicant: The Boeing Company, Chicago, IL (US)

(72) Inventor: Amir L. Liaghati, Huntsville, AL (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 14/836,916

(22) Filed: Aug. 26, 2015

(51) Int. Cl.
*H03M 7/32* (2006.01)
*H03M 3/04* (2006.01)
*H03M 7/30* (2006.01)

(52) U.S. Cl.
CPC ............ *H03M 3/04* (2013.01); *H03M 7/3051* (2013.01); *H03M 7/3053* (2013.01)

(58) Field of Classification Search
CPC .... H03M 3/04; H03M 7/3053; H03M 7/3051; H03M 1/12; H03M 3/458
USPC ......................................... 341/110, 143, 155
See application file for complete search history.

(56) References Cited

U.S. PATENT DOCUMENTS

| | | | |
|---|---|---|---|
| 2,605,361 A | 7/1952 | Cutler | |
| 6,137,922 A * | 10/2000 | Broussard | ............ H04N 19/593 375/E7.252 |
| 6,249,611 B1 * | 6/2001 | Broussard | ............ H04N 19/593 375/E7.252 |
| 6,456,145 B1 * | 9/2002 | Pertijs | ....................... G01D 3/02 327/106 |
| 6,496,537 B1 * | 12/2002 | Kranawetter | ........... H03M 7/40 348/E5.108 |
| 6,686,857 B2 * | 2/2004 | LoCasale | ................ H03M 7/30 341/110 |
| 2011/0227772 A1 * | 9/2011 | Maurino | ............... H03M 1/005 341/143 |

OTHER PUBLICATIONS

Mansour et al., "Simulation of DPCM and ADM Systems," Computer Modelling and Simulation (UKSim), 2012 UKSim 14th International Conference, pp. 416-421, Mar. 28-30, 2012, 6 pages.
Simkus et al., "Ultra-low delay lossy audio coding using DPCM and block companded quantization," 2013 Australian Communications Theory Workshop (AusCTW); pp. 43-46, Jan. 29-Feb. 1, 2013, 4 pages.
Liaghati, Amir L., "Adaptive Compression of Data" U.S. Appl. No. 14/609,007 as filed with the U.S. Patent and Trademark Office on Jan. 29, 2015, 34 pages.
Liaghati, Amir L. "Lossless Compression of Data Based on a Modified Differential Pulse Code Modulation (DPCM) Scheme" U.S. Appl. No. 14/705,337 as filed with the U.S. Patent and Trademark Office on May 6, 2015, 27 pages.

* cited by examiner

*Primary Examiner* — Jean B Jeanglaude
(74) *Attorney, Agent, or Firm* — Kolisch Hartwell, P.C.

(57) ABSTRACT

A signal encoding and compression system with dynamic downsampling may include an encoder module configured to decimate a first digital signal, thereby producing a second digital signal. Each signal may then be DPCM-encoded. Decision logic may then be used to determine which encoded signal to provide as an output, based on a characteristic of the original signal.

20 Claims, 6 Drawing Sheets

SIGNAL ENCODING AND COMPRESSION WITH DYNAMIC DOWNSAMPLING

CROSS-REFERENCES

The following related applications and materials are incorporated herein, in their entireties, for all purposes: U.S. patent application Ser. No. 14/705,337.

FIELD

This disclosure relates to systems and methods for compressing signals. More specifically, the disclosed embodiments relate to differential pulse code modulation of digital signals.

INTRODUCTION

Differential pulse code modulation (DPCM) is a method for encoding an analog signal as a digital signal. Specifically, the analog signal is sampled at regular intervals, and a difference or "delta" between each actual sampled value and a reference value is quantized and encoded as a digital value. The reference value may be determined as a predicted value based on one or more previous samples of the same analog signal. Unlike pulse code modulation, in which the digital value represents the sample value, the DPCM digital value represents a difference between samples (or between a sample and a reference value).

The analog signal may be from any of various sources. Analog signals may be produced by sensors configured to sense physical information, such as temperature, sound, pressure, vibration, etc. Physical information may be collected from various sensors in a system, and the system may be monitored or modeled based on digital data representing the sensor information.

In terms of bandwidth utilization and storage space, DPCM is a relatively efficient approach for storing and/or transmitting such information. This is because only the quantized differences are encoded and transmitted, rather than the actual magnitudes of the sampled values, which are presumably larger than the differences. In some examples, DPCM compares two successive analog amplitude values, quantizes and encodes the difference between the analog amplitude values, and transmits the differential value. By, for example, transmitting the first actual sampled value and then the sequence of delta values, the sequence of actual sampled values can be recreated losslessly. However, by using the smaller deltas rather than the sampled amplitudes, the amount of data transmitted or stored is reduced.

Standard DPCM is preconfigured to handle the expected analog signal and desired granularity. In other words, the sample rate of the analog signal, and the byte size allocated to each delta value are typically determined in advance, based on expected "worst case" signal characteristics and/or desired fidelity of sampling with respect to the actual signal. This preconfiguring of the DPCM settings can lead to inefficiency.

SUMMARY

The present disclosure provides systems, apparatuses, and methods relating to signal coding and compression with dynamic downsampling.

In some embodiments, a sensing system may include: a transducer configured to convert sensed variations in a physical quantity to an analog electrical signal; an analog to digital converter (ADC) in communication with the transducer, the ADC configured to convert the analog electrical signal to a first digital signal having a first sampling rate and a plurality of first discrete-time values; and an encoder module in communication with the ADC, the encoder module configured to: decimate the first digital signal to produce a second digital signal having a second sampling rate and a plurality of second discrete-time values, generate a first set of first deltas, each first delta corresponding to a respective difference between one of the first discrete-time values and a selected first reference value, generate a second set of second deltas, each second delta corresponding to a respective difference between one of the second discrete-time values and a selected second reference value, and choose, based on a characteristic of the first digital signal, whether to output the first set or to output the second set.

In some embodiments, a signal compression device utilizing differential pulse code modulation (DPCM) may include: a controller having a processor and a memory, the controller configured to convert a received analog signal into a first digital signal; and a plurality of instructions stored in the memory and executable by the processor to: downsample the first digital signal to generate a second digital signal; produce a first DPCM-encoded signal based on the first digital signal, the first DPCM-encoded signal having a plurality of first values; store the plurality of first values in a first buffer; produce a second DPCM-encoded signal based on the second digital signal, the second DPCM-encoded signal having a plurality of second values; store the plurality of second values in a second buffer; determine a characteristic of the first digital signal; generate a first output including the first values from the first buffer when the characteristic meets first criteria; and generate a second output including the second values from the second buffer when the characteristic meets second criteria.

In some embodiments, a computer-implemented method for compressing and encoding a digital signal using differential pulse-code modulation (DPCM) may include: receiving a digital input signal; generating a first DPCM-encoded signal based on the input signal; downsampling the input signal to produce a decimated signal; generating a second DPCM-encoded signal based on the decimated signal; and transmitting an output signal; wherein the output signal automatically switches between the first DPCM-encoded signal and the second DPCM-encoded signal based on a characteristic of the input signal.

Features, functions, and advantages may be achieved independently in various embodiments of the present disclosure, or may be combined in yet other embodiments, further details of which can be seen with reference to the following description and drawings.

DESCRIPTION

Overview

Figure 1:
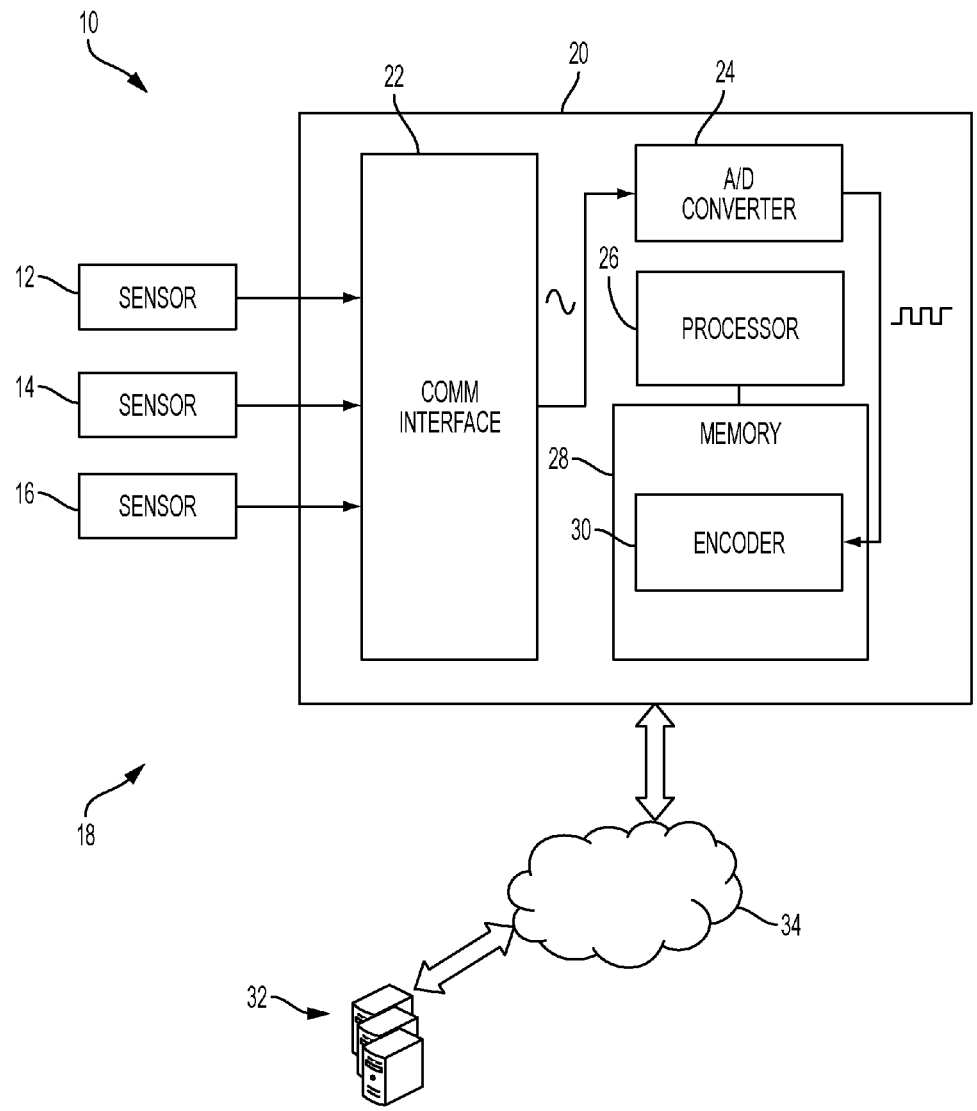
FIG. 1 is a schematic diagram of an illustrative system having a plurality of sensors and a sensor controller configured to communicate information to servers via network.

Various embodiments of a differential pulse code modulation (DPCM) encoder module having dynamic downsampling, as well as related systems and methods, are described below and illustrated in the associated drawings. Unless otherwise specified, an encoder module and/or its various components or related method steps may, but are not required to, contain at least one of the structure, components, functionality, and/or variations described, illustrated, and/or incorporated herein. Furthermore, the process steps, structures, components, functionalities, and/or variations described, illustrated, and/or incorporated herein in connection with the present teachings may, but are not required to, be included in other similar devices and methods. The following description of various embodiments is merely exemplary in nature and is in no way intended to limit the disclosure, its application, or uses. Additionally, the advantages provided by the embodiments, as described below, are illustrative in nature and not all embodiments provide the same advantages or the same degree of advantages.

In general, a dynamically downsampled DPCM encoder module may be included in a system for monitoring, processing, and/or communicating data that may change over time. For example, such a system may include one or more sensors for monitoring a physical characteristic of an environment (e.g., temperature, pressure, or the like). Sensors typically function as transducers, converting variations in a selected physical quantity into electrical signals. These electrical signals are analog signals, which may vary continuously over time.

Such analog signals are typically converted to digital form, using an analog-to-digital (A/D) converter, also referred to as an ADC. A digital signal is created by sampling the analog signal at specific intervals, producing a quantized sequence of numerical values representing the amplitude of the analog signal at each sample time. The digital signal is typically represented in binary form, such as a series of numerical byte values. The ADC will typically have a fixed sampling rate. In some examples, the ADC will have a plurality of possible sampling rates. One sampling rate may be selected, based on expected signal characteristics. In other examples, the ADC may utilize different sampling rates at different times, such as on a predetermined time- or event-based schedule.

Rather than storing or communicating that series of byte values, the data stream may be compressed. The DPCM encoder module will compress the data by subtracting a reference value from each sampled value, thereby determining a difference, referred to as a "delta." The series of deltas so produced will be smaller, numerically, than the original data. Accordingly, those deltas may be represented by smaller bytes. For example, instead of needing the sixteen-bit bytes used to represent each of the sampled value, it may be possible to represent any expected delta using only eight-bit or four-bit bytes. Accordingly, the same information may be transmitted or stored using half the memory space.

As described in greater detail below, a dynamically downsampled DPCM encoder module may reduce memory usage further by automatically reducing the sample rate when the analog signal is changing slowly or not at all. For example, rather than taking twenty samples of a barely-changing signal, the encoder may downsample the signal (i.e., reduce the sampling rate) and encode only ten samples in the same amount of time. In general, sample rate is typically set in advance, based on the expected maximum change rate of the analog signal, and then either maintained at that rate or altered based on a schedule or event-related basis. Encoder modules in accordance with aspects of the present disclosure will dynamically change between two or more sampling rates based on real-time analysis of the incoming signal. Furthermore, this advantage may be realized without altering the ADC or adding additional ADCs. For example, the ADC sampling rate may be chosen based on a worst-case scenario. Then the encoder module can be designed and/or modified to downsample from that base sampling rate depending on the signal characteristics.

An output of the encoder module may be provided to a computer network and/or to local and/or remote servers, for further analysis and storage. In some examples, other systems may utilize the information from the sensor(s). In some examples, the original sampled data may be regenerated based on the stream of deltas.

Aspects of dynamically downsampled DPCM encoder modules may be embodied as a computer method, computer system, or computer program product. Accordingly, aspects of the encoder module may take the form of an entirely hardware embodiment, an entirely software embodiment (including firmware, resident software, micro-code, and the like), or an embodiment combining software and hardware aspects, all of which may generally be referred to herein as a "circuit," "module," or "system." Furthermore, aspects of the encoder module may take the form of a computer program product embodied in a non-transitory computer-readable medium (or media) having computer-readable program code/instructions embodied thereon.

Any combination of computer-readable media may be utilized. Computer-readable media can be a computer-readable signal medium and/or a non-transitory computer-readable storage medium. A computer-readable storage medium may include an electronic, magnetic, optical, electromagnetic, infrared, and/or semiconductor system, apparatus, or device, or any suitable combination of these. More specific examples of a computer-readable storage medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, and/or any suitable combination of these and/or the like. In the context of this disclosure, a non-transitory computer-readable storage medium may include any suitable tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, and/or any suitable combination thereof. A computer-readable signal medium may include any computer-readable medium that is not a computer-readable storage medium and that is capable of communicating, propagating, or transporting a program for use by or in connection with an instruction execution system, apparatus, or device.

Program code embodied on a computer-readable medium may be transmitted using any appropriate medium, including but not limited to wireless, wireline, optical fiber cable, RF, and/or the like, and/or any suitable combination of these.

Computer program code for carrying out operations for aspects of the encoder module may be written in one or any combination of programming languages, including an object-oriented programming language such as Java, Smalltalk, C++, and/or the like, and conventional procedural programming languages, such as the C programming language. The program code may execute entirely on a local computer, partly on the local computer, as a stand-alone software package, partly on the local computer and partly on a remote computer, or entirely on the remote computer or server. In the latter scenario, the remote computer may be connected to the local computer through any type of network, including a local area network (LAN) or a wide area network (WAN), and/or the connection may be made to an external computer (for example, through the Internet using an Internet Service Provider).

Aspects of encoder modules are described below with reference to flowchart illustrations and/or block diagrams of methods, apparatuses, systems, and/or computer program products. Each block and/or combination of blocks in a flowchart and/or block diagram may be implemented by computer program instructions. The computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions can also be stored in a non-transitory computer-readable medium that can direct a computer, other programmable data processing apparatus, and/or other device to function in a particular manner, such that the instructions stored in the computer-readable medium produce an article of manufacture including instructions which implement the function/act specified in the flowchart and/or block diagram block(s).

The computer program instructions can also be loaded onto a computer, other programmable data processing apparatus, and/or other device to cause a series of operational steps to be performed on the device to produce a computer-implemented process such that the instructions which execute on the computer or other programmable apparatus provide processes for implementing the functions/acts specified in the flowchart and/or block diagram block(s).

Any flowchart and/or block diagram in the drawings is intended to illustrate the architecture, functionality, and/or operation of possible implementations of systems, methods, and computer program products in accordance with aspects of the present disclosure. In this regard, each block may represent a module, segment, or portion of code, which comprises one or more executable instructions for implementing the specified logical function(s). In some implementations, the functions noted in the block may occur out of the order noted in the drawings. For example, two blocks shown in succession may, in fact, be executed substantially concurrently, or the blocks may sometimes be executed in the reverse order, depending upon the functionality involved. Each block and/or combination of blocks may be implemented by special purpose hardware-based systems (or combinations of special purpose hardware and computer instructions) that perform the specified functions or acts.

Definitions

Differential pulse code modulation (DPCM) refers to any signal encoding method in which a sampled signal is encoded based on a difference (i.e., delta) between each of the sample values and one or more reference values.

EXAMPLES, COMPONENTS, AND ALTERNATIVES

The following sections describe selected aspects of exemplary encoder modules as well as related systems and/or methods. The examples in these sections are intended for illustration and should not be interpreted as limiting the entire scope of the present disclosure. Each section may include one or more distinct inventions, and/or contextual or related information, function, and/or structure.

Illustrative System:

As shown in FIG. 1, this section describes an illustrative sensing system, generally indicated at 10.

Sensing system 10 includes a plurality of sensors, and may include any number of sensors. In the example illustrated in FIG. 1, system 10 includes three sensors: sensor 12, sensor 14, and sensor 16. Each sensor may include any suitable structure or device configured to function as a transducer. In other words, each of sensors 12-16 may comprise a transducer configured to convert sensed variations in a physical quantity to an analog electrical signal. For example, sensors 12-16 may include a temperature sensor, a pressure sensor, an acoustic sensor, a chemical sensor, a magnetic sensor, a flow sensor, an optical sensor, an accelerometer, a force sensor, a proximity sensor, and/or the like, or any combination of these. For example, a temperature sensor may be configured to convert temperatures ranging from zero to 100 degrees Celsius to a voltage ranging from zero to five volts DC. Accordingly, the sensor will produce an analog signal that may change over time. Sensors 12-16 may be disposed in and around a given environment 18, such as in predetermined or selected locations. In some embodiments, environment 18 may be associated with a piece of equipment, a vehicle, and/or a geographic location. For example, environment 18 may include an exterior portion of a spacecraft. For example, environment 18 may include one or more monitoring stations in a wildlife preserve.

Sensors 12-16 are in communication with an electronic device, here represented by a sensor controller 20. The analog signals from sensors 12-16 are transmitted to a communications interface 22 of sensor controller 20. Each analog signal may be passed to an analog to digital converter (ADC) 24. Note that one such signal and ADC are shown in FIG. 1. Any number of signals and corresponding ADCs may be utilized. ADC 24 may include any suitable module or device configured to convert an analog signal into a digital signal. For example, ADC 24 may comprise an integrated circuit (IC) configured to sample the analog signal at periodic intervals, and to quantize each sample, thereby producing a series of discrete-time values corresponding to the original analog signal. ADCs are generally well known in the industry.

Sensor controller 20 may include a processor 26 in communication with a storage device or memory 28. Processor 26 and memory 28 are examples of processors and storage devices described in further detail below. Memory 28 may include a plurality of instructions. These instructions may be executable by the processor. Sensor controller 20 may include an encoder or encoder module 30, which may be implemented as such instructions executed by processor 26.

Encoder module 30 may include any suitable software, hardware, and/or firmware module configured to receive the digital signal produced by ADC 24 and convert it to an compressed and encoded signal in accordance with aspects of the present disclosure. Examples and aspects of encoder module 30 are described in detail with respect to FIGS. 2-4. However, general operation of encoder module 30 will now be described.

Encoder module 30 may be configured to downsample or decimate the received digital signal to produce a second digital signal having a reduced sampling rate and its own plurality of discrete-time values.

Using any suitable DPCM process, the encoder may generate a first set of deltas, each corresponding to a respective difference between one of the discrete-time values of the received signal and a selected reference value. This reference value may be a predicted value of the received signal. This reference value may correspond to the immediately-previous discrete-time value in the received signal.

The encoder may also generate a second set of deltas, again using any suitable DPCM process, each of the deltas corresponding to a respective difference between one of the discrete-time values of the decimated signal and a selected reference value. This reference value may be a predicted value of the decimated signal. This reference value may correspond to the immediately-previous discrete-time value in the decimated signal.

Based on a characteristic of the received signal, the encoder may choose whether to output the first set or to output the second set. In other words, the encoder may determine a characteristic of the received signal, and choose which of the two sets of deltas should be included in the output based on the determination. The characteristic may include any suitable characteristic of the received digital signal. In general, a goal of the algorithm may be to use a downsampled signal (i.e., the second set of deltas) if the signal has a low variability or fluctuation. In other words, the information transmitted can be reduced if the signal is not changing, or is changing at a relatively slow rate. Accordingly, the characteristic of the signal may be compared to a selected threshold.

The selected characteristic of the signal may include any suitable characteristic reflecting a likelihood that the signal is changing or will change rapidly and/or significantly. For example, one or more statistical characteristics relating to variability may be utilized. For example, with respect to the delta values and/or the sample values, determining the characteristic may include calculating a range, an interquartile range, a statistical variance, and/or a standard deviation. Any of these calculated values (i.e., characteristics) may be compared to a selected threshold value to determine whether the variability of the signal meets the criteria for outputting data based on the original signal or based on the decimated signal. Additional examples of suitable characteristics and criteria are described further below.

To continually produce an output based on the characteristic of the signal, the sets of deltas may be stored in respective temporary buffers. This allows the characteristic to be determined and a decision to be made as to which buffer should be released as the output (and which should be discarded).

Accordingly, encoder module 30 may be described as a module configured to downsample the first digital signal to generate a second digital signal; to produce a first DPCM-encoded signal based on the first digital signal, the first DPCM-encoded signal having a plurality of first values; to store the plurality of first values in a first buffer; to produce a second DPCM-encoded signal based on the second digital signal, the second DPCM-encoded signal having a plurality of second values; to store the plurality of second values in a second buffer; to determine a characteristic of the first digital signal; to generate a first output including the first values from the first buffer when the characteristic meets first criteria; and to generate a second output including the second values from the second buffer when the characteristic meets second criteria.

Put another way, encoder module 30 may be described as a module carrying out the method steps of receiving a digital input signal; generating a first DPCM-encoded signal based on the input signal; downsampling the input signal to produce a decimated signal; generating a second DPCM-encoded signal based on the decimated signal; and transmitting an output signal; wherein the output signal automatically switches between the first DPCM-encoded signal and the second DPCM-encoded signal based on a characteristic of the input signal.

In some embodiments, one or more portions of the sensor controller may be incorporated into or locally disposed with respect to the sensor. For example, a respective local ADC may be included with each sensor 12-16.

Output from sensor controller 20 may be communicated to a remote computer or data processor, such as a server (or servers) 32. This may be done, for example, to provide additional processing, display, reporting, and/or monitoring. Communication with server 32 may be performed wirelessly, through a wired connection, or via a combination of the two. Such communication may be conducted through a cloud or network 34 (e.g., the Internet). Computer networks are described in greater detail below.

Figure 2:
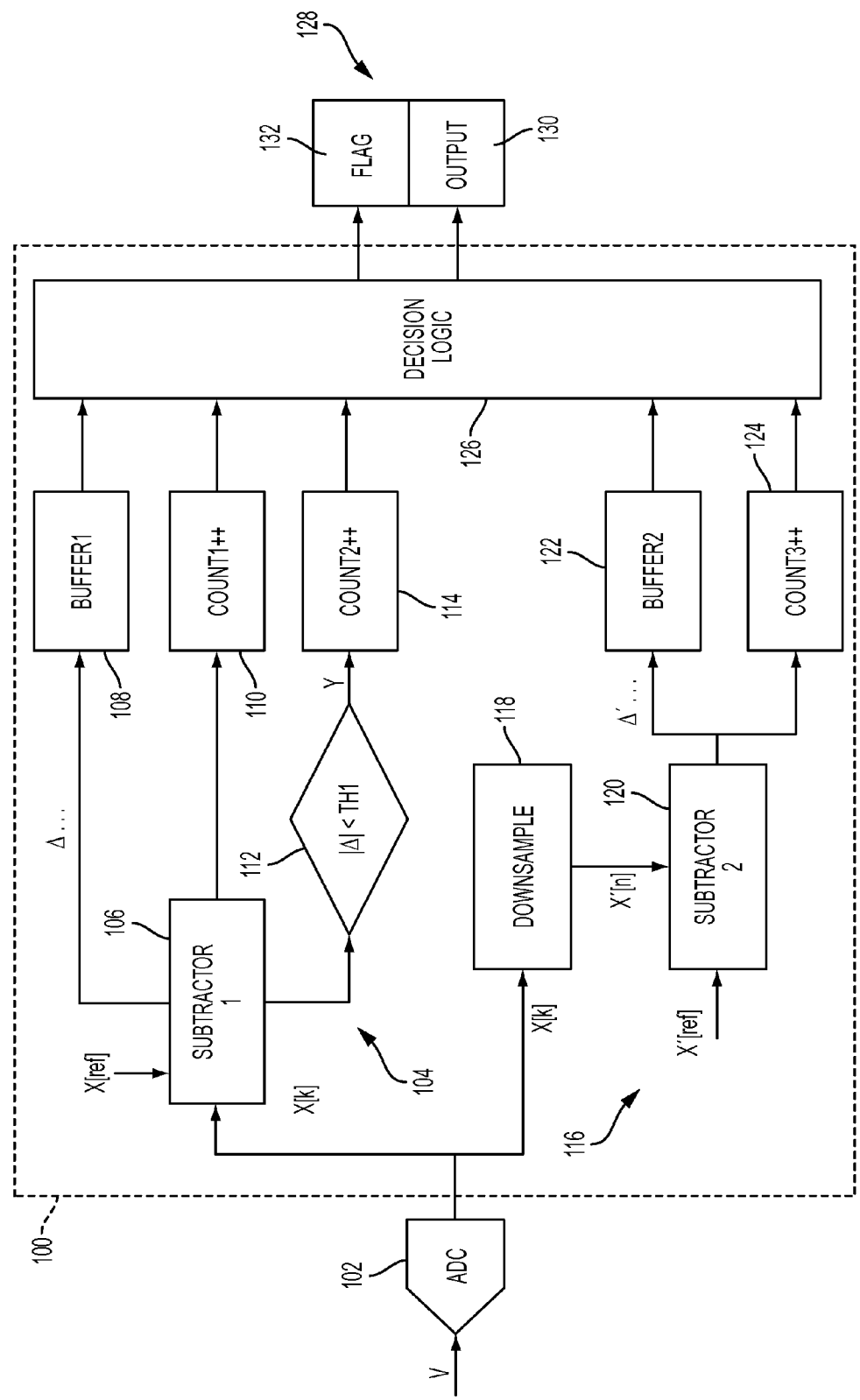
FIG. 2 is a schematic diagram of an illustrative dynamic downsampling encoder module in accordance with aspects of the present disclosure.

Illustrative Encoder Module:

As shown in FIG. 2, this section describes an illustrative encoder module 100. Encoder module 100 is an example of encoder module 30, described above.

Encoder module 100 receives a digital signal from an ADC 102. The digital signal includes a series of discrete-time values, represented in FIG. 2 as X[k], also referred to as the kth discrete-time value of signal X.

Signal X branches to two portions of encoder module 100. In a first portion 104, signal X is communicated to a first subtractor 106. Subtractor 106 may include any suitable component configured to calculate the quantitative difference between two values. Here, subtractor 106 receives each X[k] and a selected reference value, illustrated as X[ref]. This reference value may represent the predicted value of X[k]. In some examples, X[ref] may correspond to X[k−1], i.e., the immediately previous value of signal X. In some examples, X[ref] may be a reference value calculated based on one or more previous values of signal X. The value of X[ref] may change with each X[k]. In some examples, the value of X[ref] may change periodically, such as when X[ref] corresponds to an selected initial sample value for a batch or set of X[k]'s.

Regardless of the method of calculating or choosing the reference value, subtractor 106 will determine the difference between X[k] and X[ref]. This operation produces an output, referred to as a "delta" and represented by the greek symbol Δ in FIG. 2. Each such delta is stored in a first buffer 108. As each delta is calculated, a first counter 110 is incremented to keep a running count of the number of deltas. This set or series of deltas comprises a first DPCM-encoded signal.

A comparison circuit 112 is configured to compare the magnitude (e.g., absolute value) of each delta to a first threshold TH1. If the size of the delta is lower than TH1, a second counter 114 is incremented. Accordingly, second counter 114 keeps track of how many of the deltas are below a selected value, indicating that the change in the signal was small or that it was unchanged from sample to sample.

In a second portion 116 of encoder module 100, signal X is communicated to a downsampling circuit 118, also referred to as a decimator or downsampler. Downsampler 118 may include any suitable component configured to downsample signal X by a selected factor (e.g., by a factor of two). In some examples, the sampling rate may be reduced by a variable, dynamic, and/or selectable amount.

Accordingly, downsampler 118 receives each X[k] and downsamples the first signal to produce a second signal, shown as signal X'. Each discrete-time value of X' is referred to as a the nth value, or X'[n]. Each of these X'[n] values is communicated to a second subtractor 120, substantially similar to subtractor 106, where the difference between X'[n] and a reference value X'[ref] is calculated. As above, the reference value may be a predicted value of X'[n], and/or may correspond to one or more previous discrete-time value of X'. Also as above, X'[ref] may be static, may change periodically, or may change for each X'[n]. For example, X'[ref] may be equivalent to X'[n−1].

Subtractor 120 determines the difference between X'[ref] and X'[n], and produces a corresponding delta, represented in FIG. 2 as Δ'. Each such delta is stored in a second buffer 122. As each Δ' is calculated, a third counter 124 may be incremented. This set or series of deltas comprises a second DPCM-encoded signal.

First buffer 108, first counter 110, second counter 114, second buffer 122, and third counter 124 are in communication with a decision logic circuit 126. Decision logic circuit 126 may include any suitable logical components and/or instructions configured to determine whether to output the delta values stored in first buffer 108 or the delta values stored in second buffer 122. A specific example of a decision logic circuit is described further below with respect to FIG. 3.

This output decision may be based on a characteristic of signal X. For example, after a selected number of delta calculations, also referred to as a sample, the values of first counter 110 and second counter 114 may be compared to determine what percentage or fraction of the deltas are "small," indicating that the signal is not changing rapidly or variably enough to require the higher sampling rate. In that case, the encoder may take advantage of the lower sampling rate of X' by including the contents of second buffer 122 rather than the first buffer. If the sampling rate of signal X' is half that of signal X, the amount of data that will need to be transmitted in this portion of the output can be reduced correspondingly. Conversely, if the characteristic of signal X indicates that the signal is variable or changing rapidly, the higher sampling rate would be appropriate and the contents of first buffer 108 will be utilized.

Sampling of the data in this fashion may be continued repeatedly, such that each successive set of delta values is assessed and an output decision made for that set. As each set is completed, the buffers and counters may be cleared to restart the process.

Accordingly, decision logic circuit 126 will produce an output 128. Output 128 will include an output portion 130 corresponding to the data from the chosen buffer, and a flag portion 132 indicating which buffer was chosen. In other words, flag portion 132 will indicate which sampling rate was used to obtain output portion 130. Flag portion 132 may be a bit or a plurality of bits (e.g., a byte). For example, flag portion 132 may be a bit having a value of 0 when the output portion is from the first buffer and a value of 1 when the output portion is from the second buffer. This allows a receiving device to properly interpret the data.

Output 128 will comprise a series of flag/output combinations or sets as the signal is processed through encoder module 100. Each set of output values can have one of two sampling rates (or more, in some examples). To be able to reconstruct the signal, a receiving device must know what the sampling rate was for that set of values. Accordingly, the flag portion is utilized to communicate such information. In some examples, flag portion 132 is included with each set of output data. In some examples, flag portion 132 is included only when the sampling rate changes, such that the flag portion is not included when two successive sets of data are from the same buffer.

Figure 3:
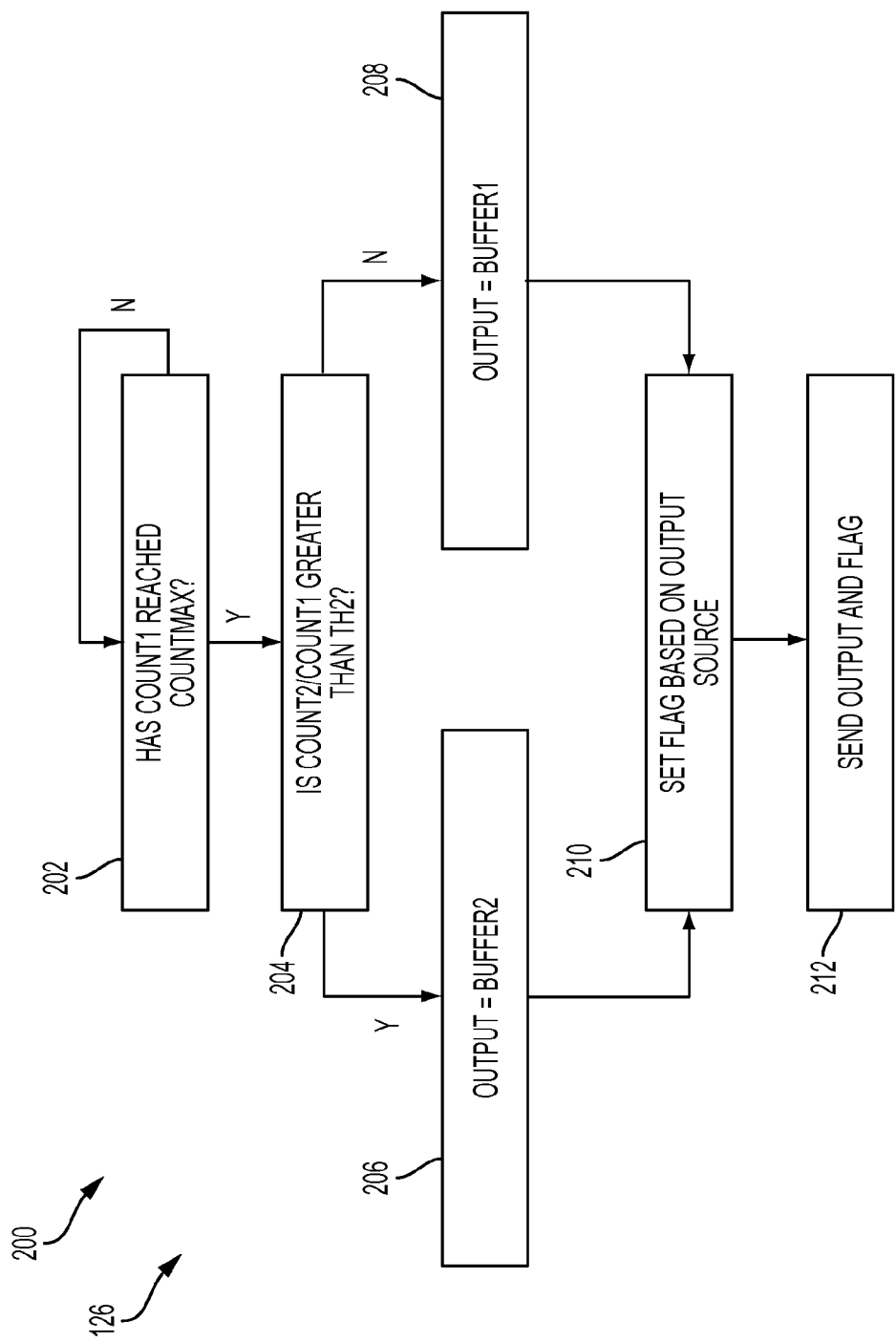
FIG. 3 is a flow chart of an illustrative algorithm for dynamically downsampling a signal.

Illustrative Decision Logic:

As shown in FIG. 3, this section describes an illustrative decision logic circuit 200. Decision logic circuit 200 is an example of decision logic circuit 126, described above, and is suitable for inclusion in encoder module 100.

In a first decision step 202, it is determined whether the set of deltas has reached a selected number. Specifically, the value of first counter 110 (e.g., Count1) is compared to a desired sample size (e.g., CountMax). If the value has not reached the desired size of the sample, meaning not enough deltas have been calculated, no action is taken. If the value has reached the desired size (CountMax), then a characteristic of the signal is compared to a selected threshold.

Here, the characteristic is calculated as the value of second counter 114 (e.g., Count2) divided by the value of first counter 110 (i.e., Count1, which at this point is equal to CountMax).

This calculation determines the percentage or fraction of deltas in the sample that are below a first threshold, referred to in this example as threshold TH1. In other words, the calculation will indicate what fraction of the deltas are "small." Next, step 204 compares this fraction to a selected second threshold TH2. If the fraction is greater than threshold TH2, indicating that the signal variability is low, decision logic circuit 200 continues with step 206, in which output portion 130 is set to the contents of second buffer 122. In other words, if the variability of the signal is found to be low, as indicated by the fraction of "small deltas" being greater than TH1, then the encoder will output the deltas from the decimated signal rather than the original signal (i.e., at the lower sample rate).

If the fraction is not greater than threshold TH2, then step 208 sets output portion 130 to the contents of first buffer 108. In other words, if the variability of the signal is found to be high, as indicated by the fraction of "small deltas" not being greater than TH1, then the encoder will output the deltas from the original signal rather than the decimated signal (i.e., at the higher sample rate).

In step 210, flag portion 132 is set based on whether step 206 or 208 is carried out. At step 212, flag portion 132 and output portion 130 are sent or transmitted.

Accordingly, a characteristic of the signal is compared to certain criteria. Here, one set of criteria may include whether the fraction is below threshold TH2, and in some examples, whether the set of deltas has reached a selected number of deltas (e.g., CountMax). Other criteria may be used. In general, first criteria leading to an output of one buffer should be mutually exclusive with second criteria leading to an output of the other buffer. This is to ensure that only a single, unambiguous choice is made by the decision logic.

Figure 4:
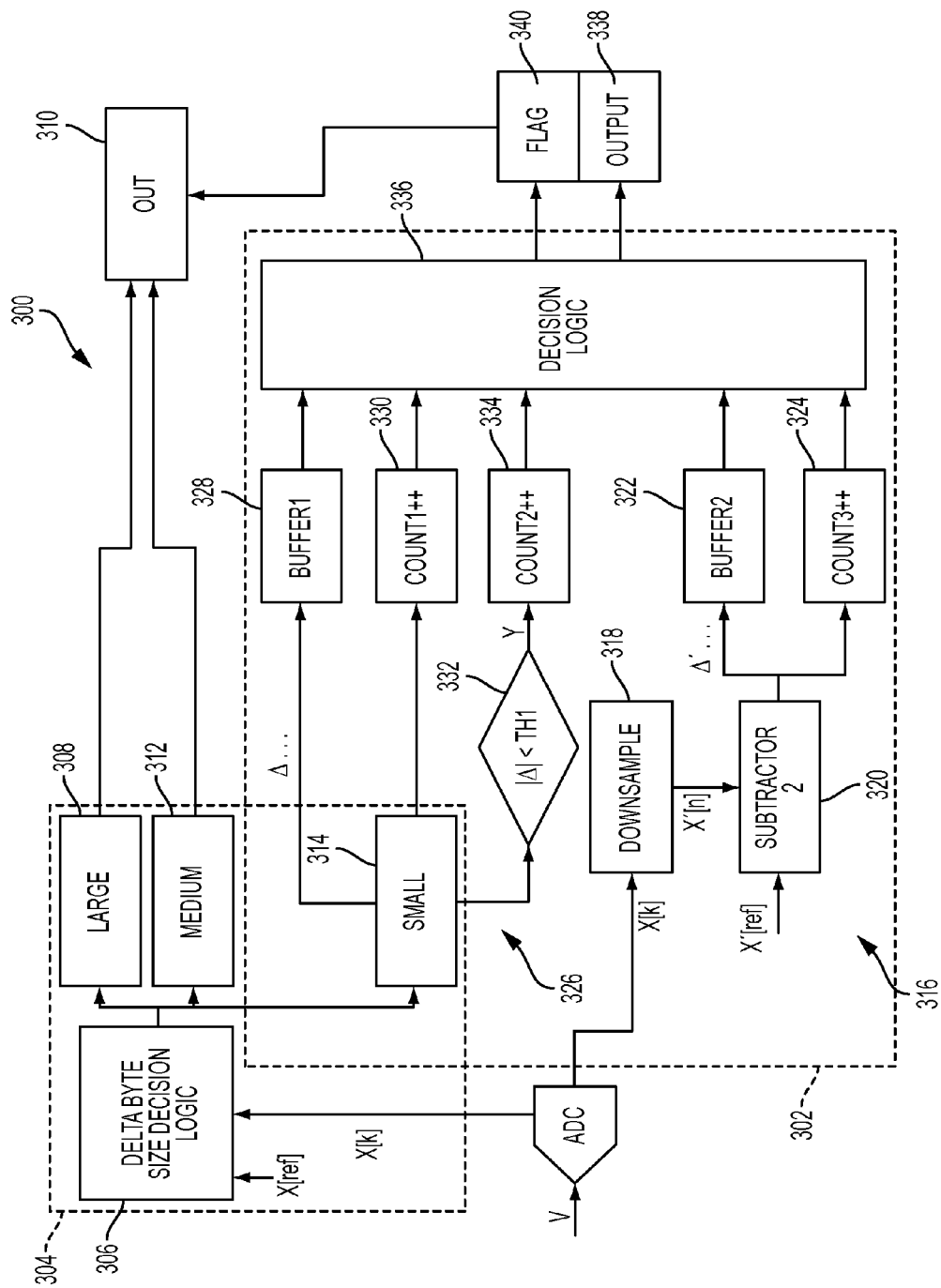
FIG. 4 is a schematic diagram of an illustrative dynamic downsampling encoder module integrated with a second illustrative encoder module configured to reduce average byte size.

Illustrative Hybrid System:

As shown in FIG. 4, this section describes an illustrative hybrid system 300 combining an illustrative encoder module 302 and an illustrative dynamic byte size decision module 304. Encoder module 302 is an example of encoder 30 and encoder 100, described above. Accordingly, similar components may be labeled with similar reference numbers.

Dynamic byte size decision module 304 is shown schematically in FIG. 4, and may include any suitable DPCM-based module(s) configured to dynamically determine an appropriate byte size for encoding deltas of a digital signal. In other words, module 304 may determine the quantized value of the difference (i.e., delta) between X[k] and X[ref], and then encode that delta in the smallest possible byte. For example, a four-bit byte may hold numbers from −8 to 7, while an eight-bit byte may hold numbers from −128 to 127, and a ten-bit byte may hold number values from −512 to 511. Any suitable byte sizes may be utilized, and two or more such sizes may be chosen, based on expected delta values. Accordingly, a delta having a small absolute value would be expressed as a small (e.g., four-bit) byte, and a delta having a higher absolute value would be expressed using a medium or large byte. A change in byte size may be flagged by reserving certain numbers to indicate the change. For example, use of the number 511 when in an eight-bit scheme may indicate that a decoder should change to ten-bit bytes for the next number. If the actual delta value is 511, that value would then be expressed in the larger byte size. This scheme effectively compresses the data without any loss of information. Suitable examples of dynamic byte size decision modules are described, for example, in U.S. patent application Ser. No. 14/705,337, which is hereby incorporated in its entirety for all purposes.

Dynamic byte size decision module 304 includes a decision block 306. Block 306 receives signal X (i.e., a series of X[k] values) and a reference value (e.g., the previous sample value), and calculates the delta. The decision block may then determine if the delta should be expressed in the default number of bits (e.g., an 8-bit value), as a number of bits less than the default value (e.g., a 4-bit value), or as a number of bits greater than the default value (e.g., a 10-bit value). These numbers of bits, i.e., byte sizes, are depicted in FIG. 4 as small, medium, and large. However, any number of possible sizes may be used. Those of ordinary skill in the art will also readily appreciate that while 4-bit, 8-bit, and 10-bits values are described, the disclosure is not limited to the present example.

Accordingly, in a large byte expression block 308, a large delta value will be expressed using a large byte, and communicated to an output block 310. Similarly, a medium byte expression block 312 will express a medium delta value using a medium sized byte. In a typical dynamic byte size decision module, the next logical step would be to simply express a small delta using a small byte in a small byte expression block 314. However, here the small delta indicates that the signal is not changing very rapidly, or is not very variable. It may therefore be possible to compress the output further by dynamically adjusting the sampling rate using an encoder module in accordance with aspects of the present disclosure.

Encoder module 302 is substantially similar to encoder module 100, described above. A second portion 316 is identical to second portion 116 of module 100. In other words, second portion 316 of module 302 includes a downsampler 318 in communication with the ADC, a second subtractor 320, a second buffer 322, and a third counter 324, all substantially as described above. Turning to a first portion 326 of module 302, small byte expression block 314 essentially takes the place of the first subtractor. Instead of calculating the difference between X[k] and X[ref], the branch including first portion 326 receives a calculated delta from decision block 306.

From that point, first portion 326 is substantially identical to first portion 104 of module 100. For example, first portion 326 includes a first buffer 328 for temporarily storing deltas, a first counter 330 for keeping a running count of the deltas, a comparison block 332 for comparing the magnitude of each delta to a threshold TH1, and a second counter 334 for counting how many of the deltas are below TH1.

As in encoder module 100, the outputs of first buffer 328, first counter 330, second counter 334, second buffer 322, and third counter 324 are communicated to a decision logic block 336. Block 336 may include any suitable decision logic configured to choose between the contents of the first buffer and the contents of the second buffer, based on a characteristic of the signal. For example, decision logic 200 may be used. Here, because larger deltas will not be passed to encoder module 302, buffers and counters will be reset if the signal is not continuously passed to module 302 for a sufficient number of consecutive samples.

As described above, with respect to FIGS. 2 and 3, decision logic block 336 will produce an output comprising an output portion 338 and a flag portion 340. Here, the information will be transmitted to output block 310.

Figure 5:
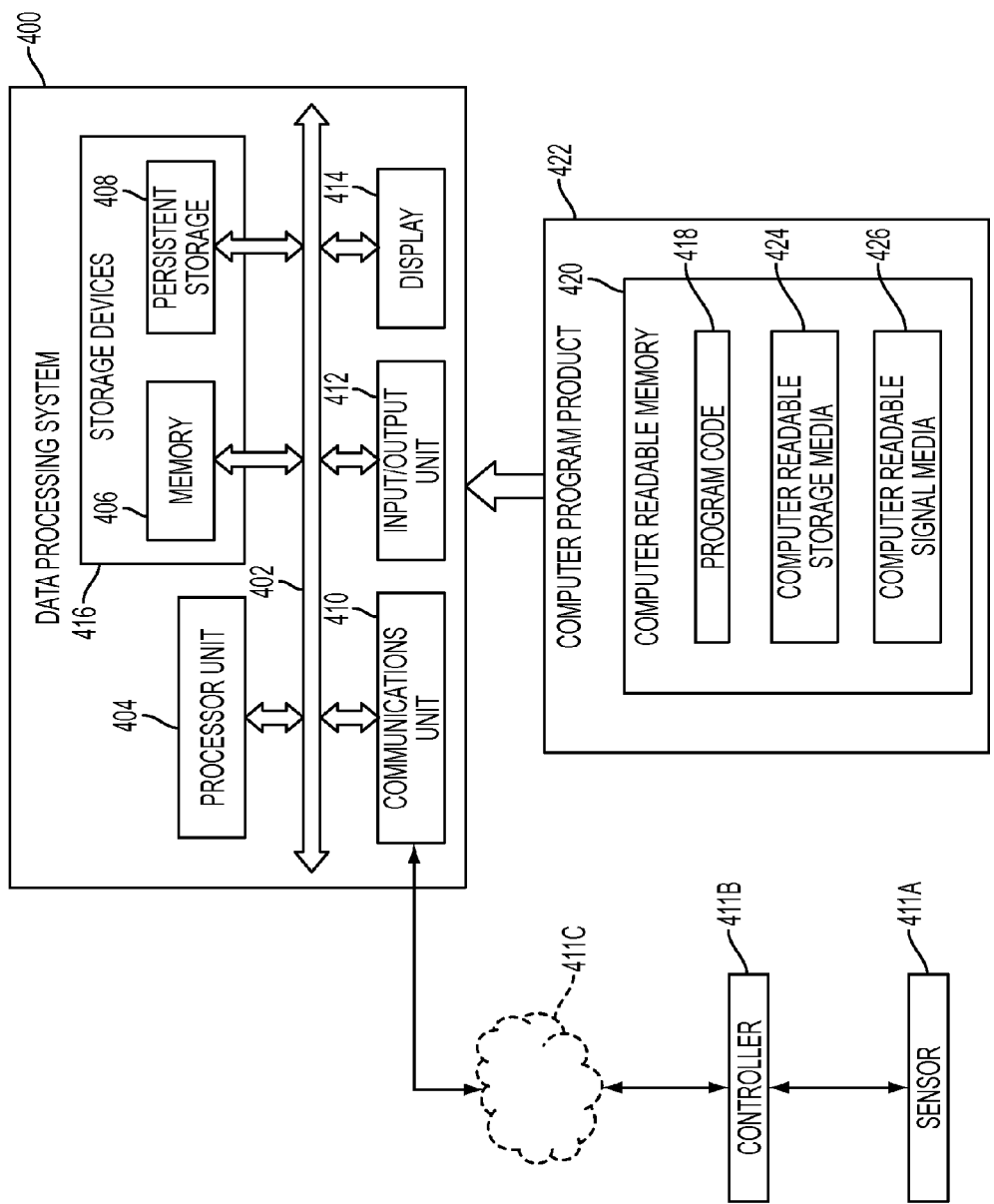
FIG. 5 is a schematic diagram of an illustrative digital processor.

Data Processing System:

As shown in FIG. 5, this section describes a computer or data processing system 400 in accordance with aspects of the present disclosure. Data processing system 400 is an illustrative data processing system suitable for implementing aspects of a signal encoding and compression system with dynamic downsampling. More specifically, in some examples, devices that are embodiments of data processing systems (e.g., smartphones, tablets, personal computers) may comprise sensor controllers (e.g., sensor controller 20), analog to digital converters (e.g., ADC 24), and/or servers (e.g., servers 32). Similarly, aspects of encoder modules, such as encoder module 30, encoder module 100, encoder module 302, and other modules (e.g., module 304), may be implemented using or as part of one or more data processing systems.

In this illustrative example, data processing system 400 includes a communications framework 402. Communications framework 402 provides communications between processor unit 404, memory 406, persistent storage 408, communications unit 410, input/output (I/O) unit 412, and display 414. Memory 406, persistent storage 408, communications unit 410, input/output (I/O) unit 412, and display 414 are examples of resources accessible by processor unit 404 via communications framework 402.

Processor unit 404 serves to run instructions that may be loaded into memory 406. Processor unit 404 may include a number of processors, a multi-processor core, or some other type of processor, depending on the particular implementation. Further, processor unit 404 may be implemented using a number of heterogeneous processor systems in which a main processor is present with secondary processors on a single chip. As another illustrative example, processor unit 404 may be a symmetric multi-processor system containing multiple processors of the same type.

Memory 406 and persistent storage 408 are examples of storage devices 416. A storage device includes any piece of hardware that is capable of storing information, such as, for example, without limitation, data, program code in functional form, and other suitable information, either on a temporary basis or a permanent basis.

Storage devices 416 also may be referred to as computer-readable storage devices in these examples. Memory 406, in these examples, may be, for example, a random access memory or any other suitable volatile or non-volatile storage device. Persistent storage 408 may take various forms, depending on the particular implementation.

For example, persistent storage 408 may contain one or more components or devices. For example, persistent storage 408 may be a hard drive, a flash memory, a rewritable optical disk, a rewritable magnetic tape, or some combination of the above. The media used by persistent storage 408 also may be removable. For example, a removable hard drive may be used for persistent storage 408.

Communications unit 410, in these examples, provides for communications with other data processing systems or devices. Communications unit 410 may include a network interface card. Communications unit 410 may provide communications through the use of physical and/or wireless communications links. As shown in FIG. 5, communications unit 410 may be used to interface, either directly or via a network (see below) with a signal encoding and compression system having dynamic downsampling. For example, a transducer such as a sensor 411A may provide an analog signal to a sensor controller 411B, which may then provide a compressed digital signal to the data processing system either directly or via network 411C.

Input/output (I/O) unit 412 allows for input and output of data with other devices that may be connected to data processing system 400. For example, input/output (I/O) unit 412 may provide a connection for user input through a keyboard, a mouse, and/or some other suitable input device. Further, input/output (I/O) unit 412 may send output to a printer. Display 414 provides a mechanism to display information to a user.

Instructions for the operating system, applications, and/or programs (e.g., encoder modules, etc.) may be located in storage devices 416, which are in communication with processor unit 404 through communications framework 402. In these illustrative examples, the instructions may be in a functional form on persistent storage 408. These instructions may be loaded into memory 406 for execution by processor unit 404. The processes of the different embodiments may be performed by processor unit 404 using computer-implemented instructions, which may be located in a memory, such as memory 406.

These instructions are referred to as program instructions, program code, computer usable program code, or computer-readable program code that may be read and executed by a processor of processor unit 404. The program code in the different embodiments may be embodied on different physical or computer-readable storage media, such as memory 406 or persistent storage 408.

Program code 418 is located in a functional form on computer-readable media 420 that is selectively removable and may be loaded onto or transferred to data processing system 400 for execution by processor unit 404. Program code 418 and computer-readable media 420 form computer program product 422 in these examples. In one example, computer-readable media 420 may be computer-readable storage media 424 or computer-readable signal media 426.

Computer-readable storage media 424 may include, for example, an optical or magnetic disk that is inserted or placed into a drive or other device that is part of persistent storage 408 for transfer onto a storage device, such as a hard drive, that is part of persistent storage 408. Computer-readable storage media 424 also may take the form of a persistent storage, such as a hard drive, a thumb drive, or a flash memory, that is connected to data processing system 400. In some instances, computer-readable storage media 424 may not be removable from data processing system 400.

In these examples, computer-readable storage media 424 is a physical or tangible storage device used to store program code 418 rather than a medium that propagates or transmits program code 418. Computer-readable storage media 424 is also referred to as a computer-readable tangible storage device or a computer-readable physical storage device. In other words, computer-readable storage media 424 is non-transitory.

Alternatively, program code 418 may be transferred to data processing system 400 using computer-readable signal media 426. Computer-readable signal media 426 may be, for example, a propagated data signal containing program code 418. For example, computer-readable signal media 426 may be an electromagnetic signal, an optical signal, and/or any other suitable type of signal. These signals may be transmitted over communications links, such as wireless communications links, optical fiber cable, coaxial cable, a wire, and/or any other suitable type of communications link. In other words, the communications link and/or the connection may be physical or wireless in the illustrative examples.

In some illustrative embodiments, program code 418 may be downloaded over a network to persistent storage 408 from another device or data processing system through computer-readable signal media 426 for use within data processing system 400. For instance, program code stored in a computer-readable storage medium in a server data processing system may be downloaded over a network from the server to data processing system 400. The data processing system providing program code 418 may be a server computer, a client computer, or some other device capable of storing and transmitting program code 418.

The different components illustrated for data processing system 400 are not meant to provide architectural limitations to the manner in which different embodiments may be implemented. The different illustrative embodiments may be implemented in a data processing system including components in addition to and/or in place of those illustrated for data processing system 400. Other components shown in FIG. 5 can be varied from the illustrative examples shown. The different embodiments may be implemented using any hardware device or system capable of running program code. As one example, data processing system 400 may include organic components integrated with inorganic components and/or may be comprised entirely of organic components (excluding a human being). For example, a storage device may be comprised of an organic semiconductor.

In another illustrative example, processor unit 404 may take the form of a hardware unit that has circuits that are manufactured or configured for a particular use. This type of hardware may perform operations without needing program code to be loaded into a memory from a storage device to be configured to perform the operations.

For example, when processor unit 404 takes the form of a hardware unit, processor unit 404 may be a circuit system, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, a field programmable logic array, a field programmable gate array, and other suitable hardware devices. With this type of implementation, program code 418 may be omitted, because the processes for the different embodiments are implemented in a hardware unit.

In still another illustrative example, processor unit 404 may be implemented using a combination of processors found in computers and hardware units. Processor unit 404 may have a number of hardware units and a number of processors that are configured to run program code 418. With this depicted example, some of the processes may be implemented in the number of hardware units, while other processes may be implemented in the number of processors.

In another example, a bus system may be used to implement communications framework 402 and may be comprised of one or more buses, such as a system bus or an input/output bus. Of course, the bus system may be implemented using any suitable type of architecture that provides for a transfer of data between different components or devices attached to the bus system.

Additionally, communications unit 410 may include a number of devices that transmit data, receive data, or both transmit and receive data. Communications unit 410 may be, for example, a modem or a network adapter, two network adapters, or some combination thereof. Further, a memory may be, for example, memory 406, or a cache, such as that found in an interface and memory controller hub that may be present in communications framework 402.

The flowcharts and block diagrams described herein illustrate the architecture, functionality, and operation of possible implementations of systems, methods, and computer program products according to various illustrative embodiments. In this regard, each block in the flowcharts or block diagrams may represent a module, segment, or portion of code, which comprises one or more executable instructions for implementing the specified logical function or functions. It should also be noted that, in some alternative implementations, the functions noted in a block may occur out of the order noted in the drawings. For example, the functions of two blocks shown in succession may be executed substantially concurrently, or the functions of the blocks may sometimes be executed in the reverse order, depending upon the functionality involved.

Figure 6:
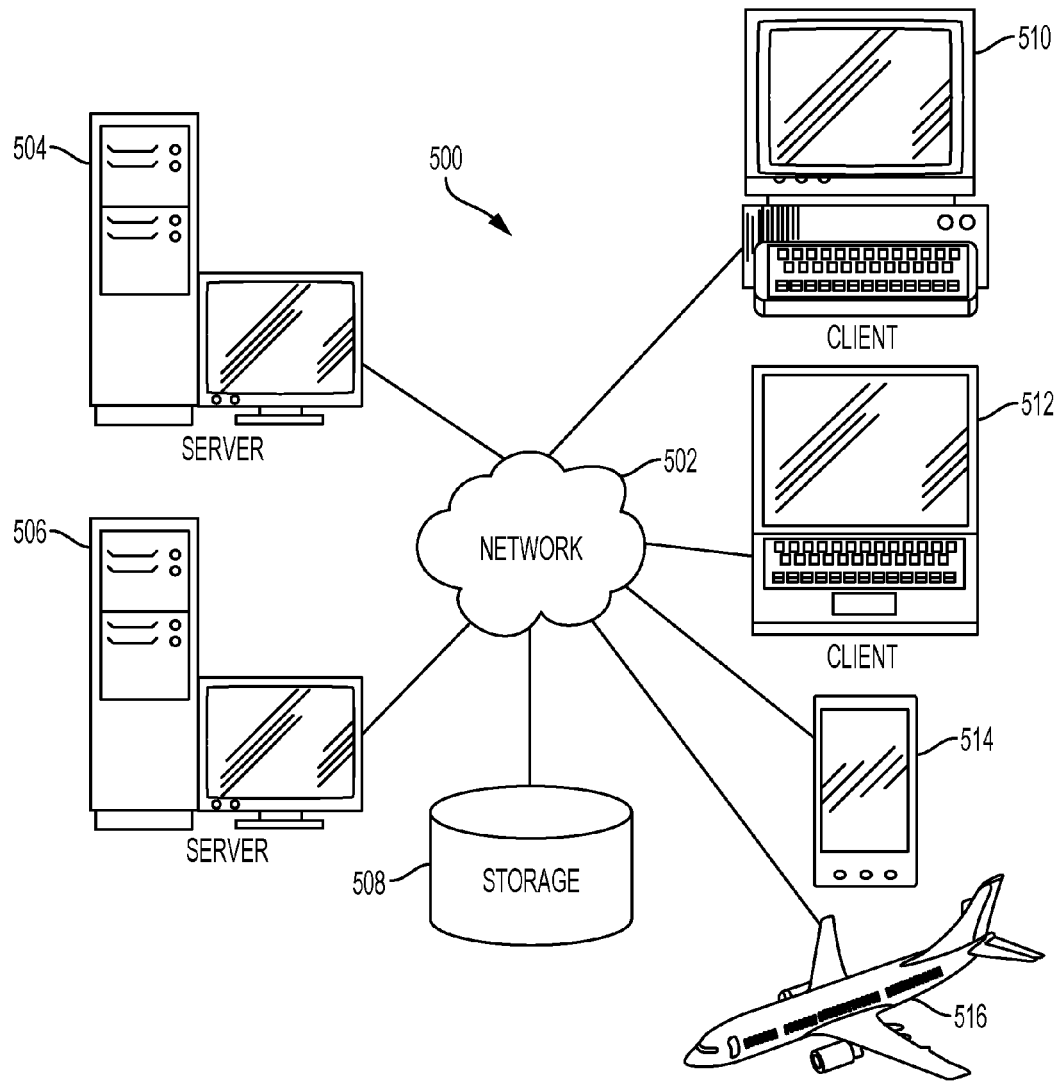
FIG. 6 is a schematic diagram of an illustrative computer network.

Computer Network:

As shown in FIG. 6, this example describes a general network data processing system 500, interchangeably termed a network, a computer network, a network system, or a distributed network, aspects of which may be included in one or more illustrative embodiments of a signal encoding and compression system having dynamic downsampling. For example, portions of such a system may be distributed over a network, and/or various components of the system may communicate with each other via a network. For example, a sensor may communicate over a network with a sensor controller, and/or a sensor controller may communicate over a network with a remote server.

It should be appreciated that FIG. 6 is provided as an illustration of one implementation and is not intended to imply any limitation with regard to environments in which different embodiments may be implemented. Many modifications to the depicted environment may be made.

Network data processing system 500 is a network of computers, each of which is an example of data processing system 400, and other components. Network data processing system 500 may include network 502, which is a medium configured to provide communications links between various devices and computers connected together within network data processing system 500. Network 502 may include connections such as wired or wireless communication links, fiber optic cables, and/or any other suitable medium for transmitting and/or communicating data between network devices, or any combination thereof.

In the depicted example, a first network device 504 and a second network device 506 connect to network 502, as does an electronic storage device 508. Network devices 504 and 506 are each examples of data processing system 400, described above. In the depicted example, devices 504 and 506 are shown as server computers. However, network devices may include, without limitation, one or more personal computers, mobile computing devices such as personal digital assistants (PDAs), tablets, and smart phones, handheld gaming devices, wearable devices, tablet computers, routers, switches, voice gates, servers, electronic storage devices, imaging devices, and/or other networked-enabled tools that may perform a mechanical or other function. These network devices may be interconnected through wired, wireless, optical, and other appropriate communication links.

In addition, client electronic devices, such as a client computer 510, a client laptop or tablet 512, and/or a client smartdevice 514, may connect to network 502. Each of these devices is an example of data processing system 400, described above regarding FIG. 5. In some examples, communications-enabled data processing systems on one or more aircraft or spacecraft 516 may connect to network 502. Client electronic devices 510, 512, 514, and 516 may include, for example, one or more personal computers, network computers, and/or mobile computing devices such as personal digital assistants (PDAs), smart phones, handheld gaming devices, wearable devices, and/or tablet computers, and the like. In the depicted example, server 504 provides information, such as boot files, operating system images, and applications to one or more of client electronic devices 510, 512, and 514. Client electronic devices 510, 512, and 514 may be referred to as "clients" with respect to a server such as server computer 504. Network data processing system 500 may include more or fewer servers and clients or no servers or clients, as well as other devices not shown.

Client smartdevice 514 may include any suitable portable electronic device capable of wireless communications and execution of software, such as a smartphone or a tablet. Generally speaking, the term "smartphone" may describe any suitable portable electronic device having more advanced computing ability and network connectivity than a typical mobile phone. In addition to making phone calls (e.g., over a cellular network), smartphones may be capable of sending and receiving emails, texts, and multimedia messages, accessing the Internet, and/or functioning as a web browser. Smartdevices (e.g., smartphones) may also include features of other known electronic devices, such as a media player, personal digital assistant, digital camera, video camera, and/or global positioning system. Smartdevices (e.g., smartphones) may be capable of connecting with other smartdevices, computers, or electronic devices wirelessly, such as through near field communications (NFC), BLUETOOTH®, WiFi, or mobile broadband networks. Wireless connectively may be established among smartdevices, smartphones, computers, and other devices to form a mobile network where information can be exchanged.

Program code located in system 500 may be stored in or on a computer recordable storage medium, such as persistent storage 408 in Example 1, and may be downloaded to a data processing system or other device for use. For example, program code may be stored on a computer recordable storage medium on server computer 504 and downloaded for use to client 510 over network 502 for use on client 510.

Network data processing system 500 may be implemented as one or more of a number of different types of networks. For example, system 500 may include an intranet, a local area network (LAN), a wide area network (WAN), or a personal area network (PAN). In some examples, network data processing system 500 includes the Internet, with network 502 representing a worldwide collection of networks and gateways that use the transmission control protocol/Internet protocol (TCP/IP) suite of protocols to communicate with one another. At the heart of the Internet is a backbone of high-speed data communication lines between major nodes or host computers. Thousands of commercial, governmental, educational and other computer systems may be utilized to route data and messages. FIG. 6 is intended as an example, and not as an architectural limitation for any illustrative embodiments.

Selected Examples and Embodiments

This section describes additional aspects and features of a signal encoding and compression system with dynamic downsampling, as well as related devices and systems, presented without limitation as a series of paragraphs, some or all of which may be alphanumerically designated for clarity and efficiency. Each of these paragraphs can be combined with one or more other paragraphs, and/or with disclosure from elsewhere in this application, including the materials incorporated by reference in the Cross-References, in any suitable manner. Some of the paragraphs below expressly refer to and further limit other paragraphs, providing without limitation examples of some of the suitable combinations.

A0. A sensing system comprising: a transducer configured to convert sensed variations in a physical quantity to an analog electrical signal; an analog to digital converter (ADC) in communication with the transducer, the ADC configured to convert the analog electrical signal to a first digital signal having a first sampling rate and a plurality of first discrete-time values; and an encoder module in communication with the ADC, the encoder module configured to: decimate the first digital signal to produce a second digital signal having a second sampling rate and a plurality of second discrete-time values, generate a first set of first deltas, each first delta corresponding to a respective difference between one of the first discrete-time values and a selected first reference value, generate a second set of second deltas, each second delta corresponding to a respective difference between one of the second discrete-time values and a selected second reference value, and choose, based on a characteristic of the first digital signal, whether to output the first set or to output the second set.

A1. The sensing system of A0, wherein the characteristic of the first digital signal is calculated by comparing the first deltas to a first threshold.

A2. The sensing system of A1, wherein the characteristic of the first digital signal is a fraction of the set of first deltas that fall below the first threshold.

A3. The sensing system of A2, wherein determining whether to output the first set or to output the second set includes comparing the fraction to a second threshold.

A4. The sensing system of any of paragraphs A0 through A3, wherein the first reference value is an immediately-previous one of the first discrete-time values.

A5. The sensing system of any of paragraphs A0 through A4, wherein the ADC comprises an integrated circuit.

A6. The sensing system of any of paragraphs A0 through A5, wherein, in response to choosing to output the first set, the encoder module is further configured to output the first set and a first flag.

A7. The sensing system of any of paragraphs A0 through A6, wherein, in response to choosing to output the second set, the encoder module is further configured to output the second set and a second flag.

A8. The sensing system of any of paragraphs A0 through A7, wherein choosing whether to output the first set or to output the second set is performed periodically.

A9. The sensing system of A8, wherein choosing whether to output the first set or to output the second set is performed when the first set reaches a selected number of first deltas.

A10. The sensing system of any of paragraphs A0 through A9, wherein the first sampling rate is fixed.

A11. The sensing system of any of paragraphs A0 through A10, wherein the first set of first deltas is stored in a first buffer.

A12. The sensing system of A11, wherein the second set of second deltas is stored in a second buffer.

A13. The sensing system of A12, wherein, in response to choosing to output the first set, the encoder module is further configured to clear the second buffer.

A14. The sensing system of any of paragraphs A0 through A13, wherein the transducer comprises a sensor and the ADC and encoder collectively comprise a sensor controller.

B0. A signal compression device utilizing differential pulse code modulation (DPCM), the device comprising: a controller having a processor and a memory, the controller configured to convert a received analog signal into a first digital signal; and a plurality of instructions stored in the memory and executable by the processor to: downsample the first digital signal to generate a second digital signal; produce a first DPCM-encoded signal based on the first digital signal, the first DPCM-encoded signal having a plurality of first values; store the plurality of first values in a first buffer; produce a second DPCM-encoded signal based on the second digital signal, the second DPCM-encoded signal having a plurality of second values; store the plurality of second values in a second buffer; determine a characteristic of the first digital signal; generate a first output including the first values from the first buffer when the characteristic meets first criteria; and generate a second output including the second values from the second buffer when the characteristic meets second criteria.

B1. The device of B0, wherein the first criteria and the second criteria are mutually exclusive.

B2. The device of any of paragraphs B0 through B1, wherein the characteristic of the first digital signal is calculated by comparing the first values to a first threshold.

B3. The device of B2, wherein the characteristic of the first digital signal is the fraction of the plurality of first values that fall below the first threshold.

B4. The device of B3, wherein the first criteria include a comparison of the fraction to a second threshold.

B5. The device of B4, wherein the first criteria further requires that the plurality of first values include a selected number of first values.

B6. The device of any of paragraphs B0 through B5, wherein the controller further comprises an analog to digital converter configured to convert the received analog signal into the first digital signal.

B7. The device of any of paragraphs B0 through B6, wherein the first output further includes a first flag indicating that the first values correspond to the first DPCM-encoded signal.

B8. The device of any of paragraphs B0 through B7, wherein the second output further includes a second flag indicating that the second values correspond to the second DPCM-encoded signal.

B9. The device of any of paragraphs B0 through B8, wherein the first digital sample has a fixed sampling rate.

B10. The device of any of paragraphs B0 through B9, wherein the plurality of instructions are further executable by the processor to clear the first buffer and the second buffer.

C0. A computer-implemented method for compressing and encoding a digital signal using differential pulse-code modulation (DPCM), the method comprising: receiving a digital input signal; generating a first DPCM-encoded signal based on the input signal; downsampling the input signal to produce a decimated signal; generating a second DPCM-encoded signal based on the decimated signal; and transmitting an output signal; wherein the output signal automatically switches between the first DPCM-encoded signal and the second DPCM-encoded signal based on a characteristic of the input signal.

C1. The method of C0, wherein the characteristic of the input signal is a variability of the input signal.

C2. The method of any of paragraphs C0 through C1, further including determining the characteristic of the input signal by calculating the fraction of delta values of the first DPCM-encoded signal that fall below a first threshold.

C3. The method of C2, wherein switching between the first DPCM-encoded signal and the second DPCM-encoded signal based on the characteristic of the input signal includes comparing the fraction to a second threshold.

C4. The method of any of paragraphs C0 through C3, wherein receiving the digital input signal includes receiving the digital input signal from an analog to digital converter (ADC).

C5. The method of C4, wherein the ADC has a fixed sampling rate.

C6. The method of any of paragraphs C0 through C5, wherein transmitting the output signal includes transmitting a flag when the output signal automatically switches between the first DPCM-encoded signal and the second DPCM-encoded signal.

C7. The method of any of paragraphs C0 through C6, further including storing a portion of the first DPCM-encoded signal in a buffer.

C8. The method of C7, further including clearing the buffer.

Advantages, Features, Benefits

The different embodiments of the signal encoding and compression systems and methods including dynamic downsampling described herein provide several advantages over known solutions. For example, illustrative embodiments described herein allow use of a single ADC having a fixed sampling rate, while providing compression at multiple possible sampling rates.

Additionally, and among other benefits, illustrative embodiments described herein provide improved signal compression over known DPCM methods. Additional data reduction may be achieved for transmission and/or storage when downsampling is acceptable.

No known system or device can perform these functions. However, not all embodiments described herein provide the same advantages or the same degree of advantage.

Conclusion

The disclosure set forth above may encompass multiple distinct examples with independent utility. Although each of these has been disclosed in its preferred form(s), the specific embodiments thereof as disclosed and illustrated herein are not to be considered in a limiting sense, because numerous variations are possible. To the extent that section headings are used within this disclosure, such headings are for organizational purposes only. The subject matter of the invention(s) includes all novel and nonobvious combinations and subcombinations of the various elements, features, functions, and/or properties disclosed herein. The following claims particularly point out certain combinations and subcombinations regarded as novel and nonobvious. Other combinations and subcombinations of features, functions, elements, and/or properties may be claimed in applications claiming priority from this or a related application. Such claims, whether broader, narrower, equal, or different in scope to the original claims, also are regarded as included within the subject matter of the present disclosure.

What is claimed is:

1. A sensing system comprising:
a transducer configured to convert sensed variations in a physical quantity to an analog electrical signal;
an analog to digital converter (ADC) in communication with the transducer, the ADC configured to convert the analog electrical signal to a first digital signal having a first sampling rate and a plurality of first discrete-time values; and
an encoder module in communication with the ADC, the encoder module configured to:
decimate the first digital signal to produce a second digital signal having a second sampling rate and a plurality of second discrete-time values,
generate a first set of first deltas, each first delta corresponding to a respective difference between one of the first discrete-time values and a selected first reference value,
generate a second set of second deltas, each second delta corresponding to a respective difference between one of the second discrete-time values and a selected second reference value, and
choose, based on a characteristic of the first digital signal, whether to output the first set or to output the second set.

2. The sensing system of claim 1, wherein the characteristic of the first digital signal is calculated by comparing the first deltas to a first threshold.

3. The sensing system of claim 2, wherein the characteristic of the first digital signal is a fraction of the set of first deltas that fall below the first threshold.

4. The sensing system of claim 3, wherein determining whether to output the first set or to output the second set includes comparing the fraction to a second threshold.

5. The sensing system of claim 1, wherein the first reference value is an immediately-previous one of the first discrete-time values.

6. The sensing system of claim 1, wherein, in response to choosing to output the first set, the encoder module is further configured to output the first set and a first flag.

7. The sensing system of claim 1, wherein, in response to choosing to output the second set, the encoder module is further configured to output the second set and a second flag.

8. The sensing system of claim 1, wherein choosing whether to output the first set or to output the second set is performed when the first set reaches a selected number of first deltas.

9. A signal compression device utilizing differential pulse code modulation (DPCM), the device comprising:

a controller having a processor and a memory, the controller configured to convert a received analog signal into a first digital signal; and a plurality of instructions stored in the memory and executable by the processor to:

downsample the first digital signal to generate a second digital signal;

produce a first DPCM-encoded signal based on the first digital signal, the first DPCM-encoded signal having a plurality of first values;

store the plurality of first values in a first buffer;

produce a second DPCM-encoded signal based on the second digital signal, the second DPCM-encoded signal having a plurality of second values;

store the plurality of second values in a second buffer;

determine a characteristic of the first digital signal;

generate a first output including the first values from the first buffer when the characteristic meets first criteria; and generate a second output including the second values from the second buffer when the characteristic meets second criteria.

10. The device of claim 9, wherein the first criteria and the second criteria are mutually exclusive.

11. The device of claim 9, wherein the characteristic of the first digital signal is calculated by comparing the first values to a first threshold.

12. The device of claim 11, wherein the characteristic of the first digital signal is the fraction of the plurality of first values that fall below the first threshold.

13. The device of claim 9, wherein the first output further includes a first flag indicating that the first values correspond to the first DPCM-encoded signal.

14. The device of claim 9, wherein the second output further includes a second flag indicating that the second values correspond to the second DPCM-encoded signal.

15. The device of claim 9, wherein the first digital sample has a fixed sampling rate.

16. A method for compressing and encoding a digital signal using differential pulse-code modulation (DPCM), the method comprising:

receiving, by a controller of a signal compression device, an analog input signal;

converting the analog input signal to a corresponding digital input signal using an analog-to-digital converter of the controller;

generating, using a processor of the controller, a first DPCM-encoded signal based on the digital input signal;

downsampling the digital input signal, using the processor, to produce a decimated signal;

generating, using the processor, a second DPCM-encoded signal based on the decimated signal; and transmitting an output signal from the controller;

wherein the processor automatically switches the output signal between the first DPCM-encoded signal and the second DPCM-encoded signal based on a characteristic of the digital input signal.

17. The method of claim 16, further including determining, using the processor, the characteristic of the digital input signal by calculating the fraction of delta values of the first DPCM-encoded signal that fall below a first threshold.

18. The method of claim 17, wherein switching between the first DPCM-encoded signal and the second DPCM-encoded signal based on the characteristic of the digital input signal includes comparing the fraction to a second threshold.

19. The method of claim 16, wherein transmitting the output signal includes transmitting a flag when the output signal automatically switches between the first DPCM-encoded signal and the second DPCM-encoded signal.

20. The method of claim 16, wherein converting the analog input signal to a corresponding digital input signal comprises selecting a sample rate based on expected characteristics of the digital input signal.

* * * * *